United States Patent [19]
Hasegawa et al.

[11] Patent Number: 4,875,618
[45] Date of Patent: Oct. 24, 1989

[54] WIRE STACKED BONDING METHOD

[75] Inventors: Hiroshi Hasegawa, Kanagawa; Koichi Sugimoto, Hiratsuka; Takeshi Yano, Yokohama; Tositada Netsu, Hatano; Mitsukiyo Tani, Odawara; Tosaku Kojima, Yokohama, all of Japan

[73] Assignee: Hitachi, Ltd., Tokyo, Japan

[21] Appl. No.: 112,943

[22] Filed: Oct. 27, 1987

[30] Foreign Application Priority Data

Oct. 31, 1986 [JP] Japan .................................. 61-258232

[51] Int. Cl.⁴ ........................................... H01L 21/60
[52] U.S. Cl. .................................... 228/179; 228/4.5; 219/56.1; 219/56.22; 361/405
[58] Field of Search ................. 228/179, 119, 6.2, 4.5; 361/404, 405; 219/56.1, 56.22, 56.21

[56] References Cited

U.S. PATENT DOCUMENTS

| | | |
|---|---|---|
| 3,669,333 | 6/1972 | Coucoulas . |
| 4,388,512 | 6/1983 | Salzer et al. . |
| 4,390,771 | 6/1983 | Kurtz et al. ...................... 219/56.1 |
| 4,465,913 | 9/1984 | Stokoe et al. ..................... 219/56.1 |
| 4,732,313 | 3/1988 | Kobayashi et al. ............. 219/56.22 |

FOREIGN PATENT DOCUMENTS

| | | |
|---|---|---|
| 1590345 | 12/1970 | Fed. Rep. of Germany . |
| 2622000 | 12/1977 | Fed. Rep. of Germany ...... 228/179 |
| 3519418 | 7/1986 | Fed. Rep. of Germany . |
| 0118643 | 10/1980 | Japan .................................. 228/179 |

OTHER PUBLICATIONS

Electronic Packaging & Production, Feb. 1984, pp. 124–127, Chicago, US: "Automatic Bonders Simplify LSI Computer Manufacturing".
Patent Abstracts of Japan, vol. 4, No. 40, (E-4) [522], Mar. 28, 1980, p. 97 E 4; & JP-A-55 12 712 (Tokyo Shibaura Denki K.K.) 29-01-1980.
Patent Abstracts of Japan, vol. 4, No. 137, (E-27)[619], Sep. 25, 1980, p. 15 E 27; & JP-A-55 88 348 (Tokyo Shibaura Denki K.K.)04-07-1980.

*Primary Examiner*—Richard K. Seidel
*Assistant Examiner*—Karen Skillman
*Attorney, Agent, or Firm*—Antonelli, Terry & Wands

[57] ABSTRACT

The invention relates to joining of fine wires, and more particularly to a wire bonding method suitable for connecting a number of wires within a narrow area. A first wire is bonded on a pad, and a second wire is bonded on the position where the first wire has been bonded. Bonding of a subsequent wire is performed in that the wire is stacked and bonded in similar manner mentioned above. Thus a plurality of repair wires can be bonded within one pad even if the pad area is very small.

9 Claims, 4 Drawing Sheets

WIRE STACKED BONDING METHOD

BACKGROUND OF THE INVENTION

The present invention relates to joining of fine wires, and more particularly to a wire bonding method suitable for bonding a number of wires within a narrow area.

In a multi-layer wiring substrate, in general, a plurality of electronic parts are assembled at the high density. In such a substrate, when the circuit change becomes necessary due to the design change or the design miss, wires are added later so as to deal with the circuit change.

On the other hand, on account of the high-density assembling to the substrate or the miniaturization of the substrate, the bonding pad for bonding the repair wires becomes small in size and the repair wire becomes thin. Consequently, although most of such repair wires have been bonded by soldering conventionally, bonding by ultrasonic bonding such as described in "ELECTRONIC PACKAGING & PRODUCTION " FEBRUARY 1984, P. 124–P. 127 is performed in recent years.

Ball bonding is another connecting method similar to ultrasonic bonding. Ultrasonic bonding or ball bonding as described in Japanese patent application Laid-open No. 55-88348 or patent application Laid-open No. 55-12712 has been used as a bonding method of a lead wire for drawing an electrode of a semiconductor in the prior art. FIG. 9 shows a bonded state of a repair wire by the ultrasonic bonding method, and FIG. 10 shows a bonded state by the ball bonding method. In the bonding of the lead wire, only one wire is drawn per one bonding pad. However, in the multi-layer wiring substrate, a plurality of repair wires may be drawn from one connection pad.

According to the prior art, the bonded state of a plurality of repair wires on a bonding pad is shown in FIGS. 11 and 12. FIG. 11 shows the case by the ultrasonic bonding method, and FIG. 12 shows the case by the ball bonding method.

In the prior art, when a plurality of repair wires 2 are to be bonded on a bonding pad 1, since the plane bonding is performed as shown in the figure, the bonding pad 1 must have a prescribed size corresponding to the number of wires to be bonded. Consequently, if the connection pad 1 is very small, the wires of prescribed number cannot be bonded.

SUMMARY OF THE INVENTION

An object of the invention is to provide a wire stacked bonding method wherein wires of prescribed number can be bonded even if the bonding pad is miniaturized due to high-density assembling.

A foregoing object can be attained in that a wire is bonded and then the next wire is stacked and bonded on the position of the previous bonding.

According to the wire stacked bonding method of the invention, a first wire is bonded on a pad, and a second wire is bonded on the bonded position of the first wire. Bonding of subsequent wire is performed in that the wire is stacked and bonded in the similar manner to the above description, thereby a plurality of wires can be bonded within one pad even if the pad area is very small.

DESCRIPTION OF THE PREFERRED EMBODIMENTS

Figure 1:
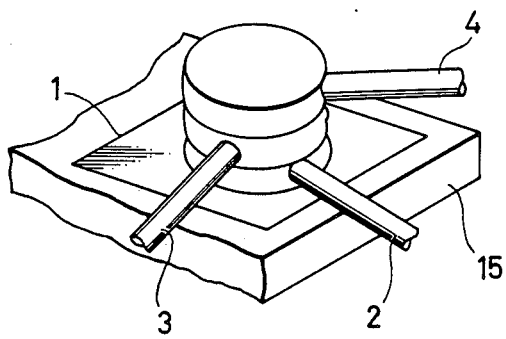
FIG. 1 is a perspective view illustrating a bonding method as an embodiment of the invention.
Figure 2:
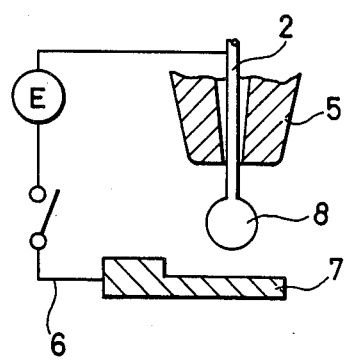
FIGS. 2 through 5 are explanation diagrams illustrating process to produce the bonded state by the bonding method of FIG. 1.
Figure 3:
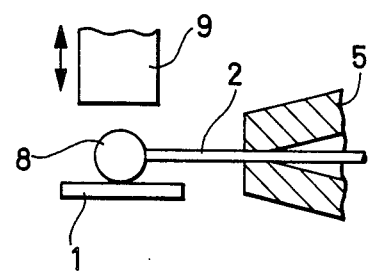
Figure 4:
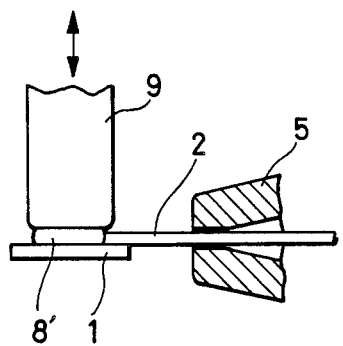
Figure 5:
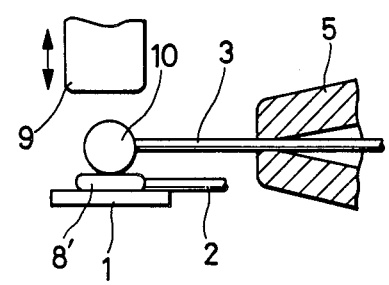
Figure 6:
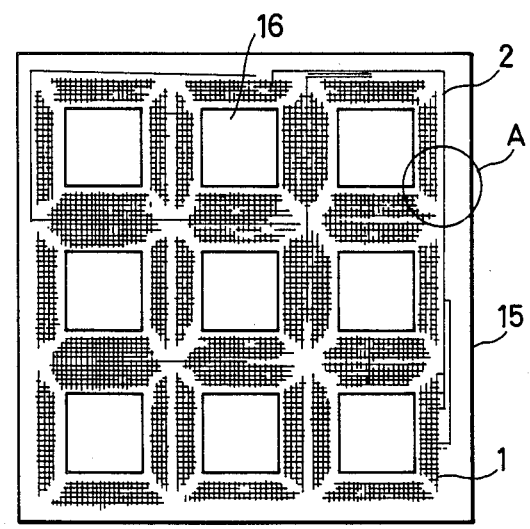
FIG. 6 is a plane view of a multi-layer module substrate.
Figure 7:
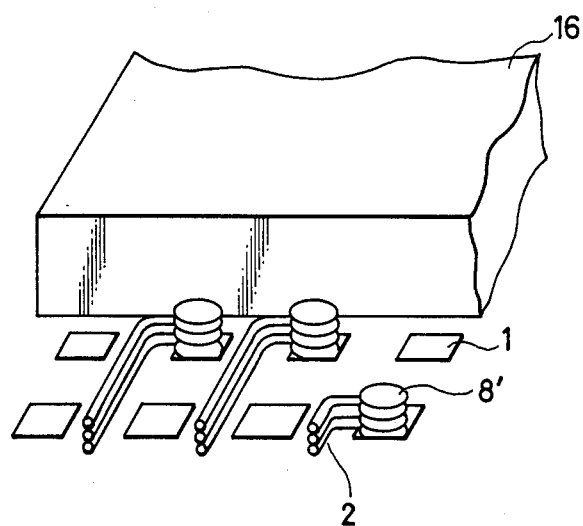
FIG. 7 is an enlarged view of portion A in FIG. 6.
Figure 8:
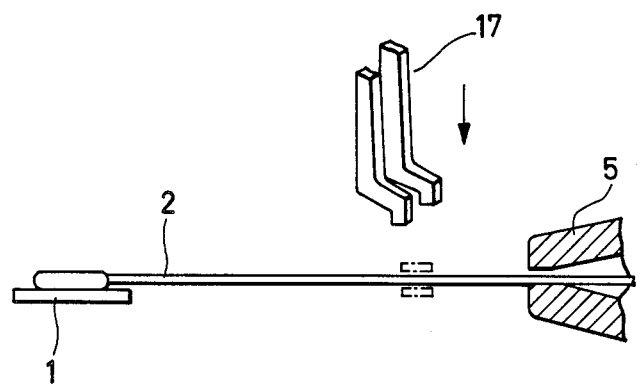
FIG. 8 is an explanation diagram illustrating ball forming process for the second bonding.
Figure 9:
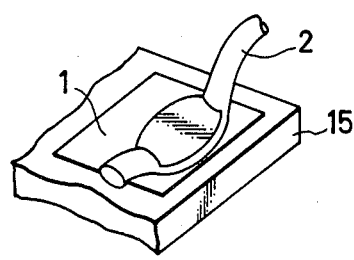
FIG. 9 is a perspective view illustrating the bonded state by the ultrasonic bonding method in the prior art.
Figure 11:
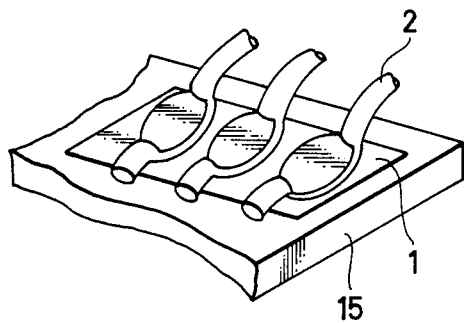
FIG. 11 is a perspective view illustrating the bonded state of plural wires by the ultrasonic bonding method in the prior art.
Figure 10:
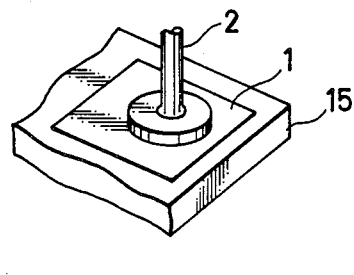
FIG. 10 is a perspective view illustrating the bonded state by the ball bonding method in the prior art.
Figure 12:
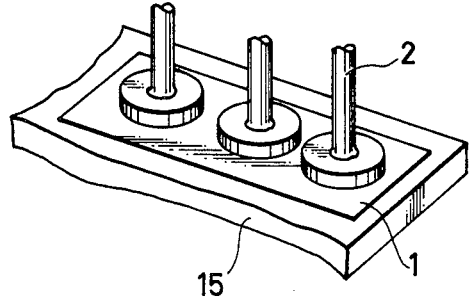
FIG. 12 is a perspective view illustrating the bonded state of plural wires by a ball bonding method in the prior art.

An embodiment of the invention will be described referring to the accompanying drawings. FIG. 1 is a perspective view of an embodiment of the invention illustrating state that a plurality of repair wires are stacked and bonded on one pad, and FIGS. 2 through 5 are diagrams illustrating bonding process of stacked bonding according to the invention. FIG. 6 shows a high-density assembled multi-layer module substrate for wiring repair wires, and FIG. 7 is an enlarged view of portion A in FIG. 6. FIG. 8 shows grip changing to perform ball formation for the second bonding. As shown in FIG. 6, a semiconductor element 16 is assembled on the multi-layer module substrate 15, and a bonding pad 1 for bonding the repair wires 2 is arranged on periphery of the semiconductor element 16. In the multi-layer module substrate 15, if circuit correction becomes necessary due to logical changes, design misses or the like, the circuit correction/change is performed by attaching the repair wire 2 to the bonding pad 1 later. Consequently, the number of the repair wires 2 to be bonded to the bonding pad 1 is not limited to one as in the case of a lead wires of semiconductor, but a plurality of repair wires 2 may be bonded. The repair wire 2 bonded to some connection pad 1 is wired to the connection pad 1 of another prescribed semiconductor element 16 and bonded to the prescribed bonding pad 1. Bonding of the plurality of repair wires 2 to one connection pad will now be described. When one repair wire is to be bonded to one connection pad 1, the connection may be performed by means of ultrasonic bonding or ball bonding as shown in FIG. 9 or FIG. 10. Also when a plurality of repair wires are to be bonded to one bonding pad using the above-mentioned ultrasonic bonding or ball bonding, the bonding is inevitably performed in the plane arrangement as shown in FIG. 11 or FIG. 12. However, if the connection pad does not have sufficient size to arrange a plurality of repair wires in one plane for the bonding, the repair wires are stacked and bonded as shown in FIG. 1. That is, the first repair wire 2 is bonded on the connection pad 1, and the second repair wire 3 and the third repair wire 4 are stacked and bonded on the first repair wire 2. Next, the process of bonding by the stacking method will be described. As shown in FIG. 2, the terminal 7 of an electric torch device 6 approaches the top end of the repair wire 2 projecting from a capillary 5, and is discharged between the repair wire 2 and the terminal 7 so that the top end of the repair wire 2 is melted to form a ball 8. Next, as shown in FIG. 3, the repair wire 2 with the ball 8 formed on its top end is positioned on the bonding pad 1 using the capillary 5. Then the repair wire 2 is held in the horizontal direction with respect to the connection pad 1. At this state, pressure is applied by a heater chip 9, and the ball 8 is heated and pressed as shown in FIG. 4 thereby the ball 8 is deformed into a disc form 8' and bonded to the bonding pad 1. Next, the second repair wire 3 with a ball 10 formed on the top end similar to the above-mentioned method is positioned on the disc-shaped portion 8' of the first repair wire 2 already bonded as shown in FIG. 5, and then heated and pressed by the heater chip 9. In such manner, the second repair wire 3 can be bonded further on the first repair wire 2 which has been bonded on the bonding pad 1. Further regarding the third repair wire and so on, the repair wire is stacked and bonded in the above-mentioned method.

Using the above-mentioned stacked bonding method, in case of wiring a repair wire 2 on a multi-layer module substrate 15 as shown in FIG. 6 circuit changes can be dealt with limited sized connection pads 1 as shown in FIG. 7, by stacking and bonding the prescribed plural number of repair wires 2.

On the other hand, using the above-mentioned stacked bonding method, the repair wire 2 which is stacked and bonded on the bonding pad 1 as shown in FIG. 1 can be drawn out freely 360° in the horizontal direction with respect to the bonding pad 1. Also as shown in FIG. 7, when the bonding pads 1 are arranged closely and the repair wires 2 are passed between the bonding pads 1 and are connected to respective pads 1 so as to perform wiring, it is particularly effective that the repair wires 2 are aligned in a definite direction. In other words, if the repair wires 2 bonded to the bonding pads 1 are drawn freely in multiple directions, and if the bonding pads 1 are closely arranged and the coating of the repair wires 2 from the disc-shaped portions 8' falls off much, the repair wires from the neighboring bonding pads 1 will be contacted with each other to cause the shortcircuit state. However, in the stacked bonding as shown in FIG. 7 where the repair wires 2 are drawn in the definite direction even if the coating falls off from the disc-shaped portions 8' considerably much, the repair wires 2 only from the same bonding pad 1 are contacted with each other and therefore the electric shortcircuit state is not produced.

In the first bonding of one repair wire, a ball can be formed using a capillary in similar manner to conventional ball bonding. However, when the repair wire 2 is wired using the capillary 5 as shown in FIG. 8, a ball for the second bonding cannot be formed in the wiring state as it is. Consequently, in order to form a ball for the second bonding, the repair wire 2 is held by a chuck 17 at the first bonding side of the second bonding ball forming position. The repair wire 2 is cut near the outlet of the capillary 5, and the ball for the second bonding is formed on the end portion of the repair wire 2 held by the chuck 17, and the ball is positioned on the prescribed bonding pad 1 by the chuck 17 so as to perform the second bonding.

As another method without using a capillary, the repair wire which is previously cut in a prescribed length, and balls are formed on both ends first to perform bonding in the second bonding as well as in the first bonding.

According to the invention, a plurality of fine wires can be bonded to the bonding pad with a limited size. Since a plurality of fine wires are stacked and bonded each wire can be drawn freely 360° in the horizontal direction so as the wire can be wired freely.

Regarding the bonding strength, since the wire need not to be crushed beyond the principle wire diameter, the cut off at the neck portion does not occur and the strength nearly equal to that of the principle wire can be obtained.

What is claimed is:

1. A wire stacked bonding method wherein ends of a plurality of wires are stacked on a bonding pad which comprises a first series of steps including:
    a step of melting an end of one wire of a plurality of wires to form a ball at the end of the wire;
    a step of positioning the ball on a planar surface of the bonding pad with the wire extending in parallel with the planar surface; and
    a step of heating and pressing the ball to form the ball into a first disc-like form and to bond the first disc-like form to said bonding pad;
  followed by a second series of steps including:
    a step of heating an end of another wire of said plurality of wires to form a ball at the end of the other wire;
    a step of positioning the ball at the end of the other wire on an exposed surface of the first disc-like form with the other wire extending in parallel with the surface of the bonding pad;
    a step of heating and pressing the ball to form a second disc-like form and to bond the second disc-like form onto the surface of the first disc-like form bonded to the bonding pad thereby forming a stack of the disc-like forms bonded onto the bonding pad.

2. A wire stacked bonding method according to claim 1, wherein said steps of positioning each of a plurality of wires in parallel with the surface of the bonding pad are effected with a capillary.

3. A wire stacked bonding method according to claim 1, further comprising arranging a portion of each of the plurality of bonding wires to extend in a longitudinal direction parallel with a surface of the bonding pad.

4. A wire stacked bonding method according to claim 1, wherein the steps of heating and pressing each ball to deform the ball into a disc-like form are effected with a heater chip.

5. A wire stacked bonding method according to claim 1, wherein each of said wires are arranged in a longitudinal direction extending in the same direction from a circumference of a stack of said disc-like forms.

6. A wire stacked bonding method according to claim 1, further comprising repeating the second series of steps to bond at least another wire to the stack of wires bonded onto the bonding pad.

7. A wire stacked bonding method comprising:
    a step of positioning an end of a wire projecting from a capillary near a terminal of an electric torch device;
    a step of effecting electrical discharge between said wire and said terminal to melt said end of the wire to form a ball;
    a step of positioning said wire in parallel with a planar surface of a bonding pad and positioning said ball on the bonding pad with the capillary;

a step of heating said ball and pressing said ball with a heater chip to deform said ball into a disc-like form and to bond said disc-like form to said bonding pad; and repeating the preceding steps to effect bonding of another wire onto the bonded disc-like form to thereby form a plurality of stacked and bonded disc-like forms on said bonding pad.

8. A wire stacked bonding method according to claim 7, wherein each of a plurality of wires bonded to form said stack are arranged to extend in longitudinal directions in parallel with a surface of the bonding pad.

9. A wire stacked bonding method according to claim 8, wherein said longitudinal directions of said bonded wires extend in the same direction drawn from a circumference of the stack of disc-like forms.

* * * * *